(12) United States Patent
Tu et al.

(10) Patent No.: US 9,269,733 B2
(45) Date of Patent: Feb. 23, 2016

(54) IMAGE SENSOR DEVICE WITH IMPROVED QUANTUM EFFICIENCY

(71) Applicant: TAIWAN SEMICONDUCTOR MANUFACTURING CO., LTD., Hsinchu (TW)

(72) Inventors: Chien-Nan Tu, Kaohsiung (TW); Yu-Lung Yeh, Kaohsiung (TW); Hsing-Chih Lin, Tainan (TW); Chien-Chang Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 45 days.

(21) Appl. No.: 14/329,337

(22) Filed: Jul. 11, 2014

(65) Prior Publication Data

US 2016/0013232 A1    Jan. 14, 2016

(51) Int. Cl.
*H01L 23/52* (2006.01)
*H01L 27/146* (2006.01)

(52) U.S. Cl.
CPC .... *H01L 27/14625* (2013.01); *H01L 27/14612* (2013.01); *H01L 27/14621* (2013.01); *H01L 27/14627* (2013.01); *H01L 27/14645* (2013.01); *H01L 27/14685* (2013.01); *H01L 27/14689* (2013.01)

(58) Field of Classification Search
CPC ............ H01L 27/14625; H01L 27/14612; H01L 27/14645; H01L 27/14621; H01L 27/14689; H01L 27/14685; H01L 27/14627
See application file for complete search history.

(56) References Cited

U.S. PATENT DOCUMENTS

| | | | |
|---|---|---|---|
| 2008/0173347 A1* | 7/2008 | Korevaar | H01L 31/036 136/255 |
| 2010/0133529 A1* | 6/2010 | Taraschi | G03B 21/28 257/43 |
| 2014/0091234 A1* | 4/2014 | Wang | G01T 1/2002 250/486.1 |
| 2014/0205801 A1* | 7/2014 | Iwata | B08B 17/06 428/141 |
| 2014/0295145 A1* | 10/2014 | Mizuno | B32B 3/263 428/172 |

* cited by examiner

*Primary Examiner* — Victor A Mandala
(74) *Attorney, Agent, or Firm* — McDermott Will & Emery LLP

(57) ABSTRACT

A semiconductor device includes a substrate, a semiconductor layer and a switching element. The semiconductor layer is disposed on the substrate. The semiconductor layer has a light-sensing portion and includes microstructures at a side face area corresponding to the light-sensing portion. The switching element is disposed on the semiconductor layer. In the semiconductor device, the switching element and the light-sensing portion are staggered.

20 Claims, 8 Drawing Sheets

IMAGE SENSOR DEVICE WITH IMPROVED QUANTUM EFFICIENCY

BACKGROUND

Semiconductor image sensors are operated to sense light. Typically, the semiconductor image sensors include complementary metal-oxide-semiconductor (CMOS) image sensors (CIS) or charge-coupled device (CCD) sensors, which are widely used in various applications such as digital still camera (DSC), mobile phone camera, digital video (DV) and digital video recorder (DVR) applications. These semiconductor image sensors utilize an array of image sensor elements, each image sensor element including a photodiode and other elements, to absorb light and convert the sensed light into digital data or electrical signals.

In general, a CMOS image sensor adopts a stacked structure including a micro-lens layer, a color filter layer, a passivation layer and/or a semiconductor layer. However, the intensity of incident light is significantly decreased when the incident light penetrates through these layers. The decreasing of the intensity of incident light results in quantum efficiency degradation of the CMOS image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
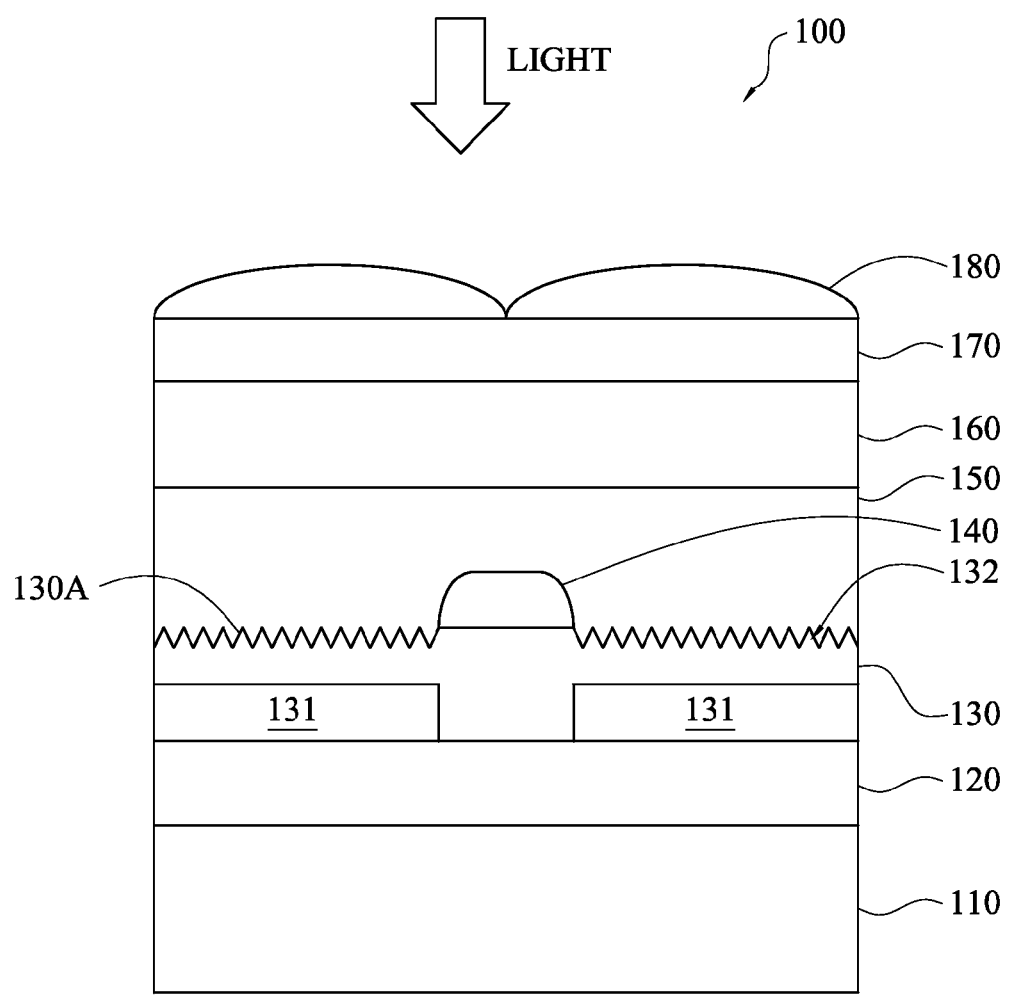
FIG. 1 is a schematic cross-sectional view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Terms used herein are only used to describe the specific embodiments, which are not used to limit the claims appended herewith. For example, unless limited otherwise, the term "a", "an" or "the" of the single form may also represent the plural form.

The terms such as "first" and "second" are used for describing various layers, though such terms are only used for distinguishing one layer from another layer. Therefore, the first layer may also be referred to as the second layer without departing from the spirit of the claimed subject matter, and the others are deduced by analogy.

Further, spatially relative terms, such as "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

Embodiments of the present disclosure are directed to providing a semiconductor device and a method for fabricating the semiconductor device, in which microstructures are formed on a side face area corresponding to a light-sensing portion, such that most of light can be refracted toward the light-sensing portion through the microstructures. By using the embodiments of the present disclosure, low light reflection and high light absorption are achieved, and, thus quantum efficiency of the semiconductor device is significantly enhanced.

FIG. 1 is schematic cross-sectional view of a semiconductor device 100 in accordance with some embodiments. The semiconductor device 100 is a BSI image sensor device configured for sensing incident light. In the present disclosure, the semiconductor device 100 is a BSI CMOS image sensor device. As shown in FIG. 1, the semiconductor device 100 includes a substrate 110, a wiring layer 120, a first semiconductor layer 130, microstructures 132, a switching element 140, a second semiconductor layer 150, a passivation layer 160, a color filter layer 170 and a micro-lens layer 180. The substrate 110 is a semiconductor substrate, which includes, but not limited to, a semiconductor wafer, a silicon-on-insulator (SOI) substrate or an epitaxial substrate. In some embodiments, the substrate 110 further includes an elementary semiconductor such as silicon, germanium or diamond. In another embodiments, the substrate 110 further includes a compound semiconductor such as silicon carbide, gallium arsenic, gallium carbide, gallium phosphide, indium arsenide, or indium phosphide, or an alloy semiconductor such as silicon germanium, silicon germanium carbide, gallium arsenic phosphide or gallium indium phosphide.

The wiring layer 120, the first semiconductor layer 130 and the switching element 140 are sequentially disposed on the substrate 110. The first semiconductor layer 130 includes a light-sensing portion 131 for sensing incident light. In some embodiments, the light-sensing portion 131 includes a photosensitive element such as a photodiode, a pinned photodiode, a partially pinned photodiode, a photogate, a photo transistor, or the like. The wiring layer 120 includes conductive features (not shown) for electrical interconnection with the light-sensing portion 131 and/or the switching element 140. In some embodiments, the conductive features (not shown) may include a material such as aluminum, aluminum alloy, copper, copper alloy, titanium, titanium nitride, polysilicon, metal silicide, combinations thereof, or the like. Further, in some embodiments, a passivation layer (not shown) may be additionally formed between the wiring layer 120 and the substrate 110.

The switching element 140 is disposed on the first semiconductor layer 130, and is used for transferring electric charges generated from the light-sensing portion 131. In some embodiments, the switching element may be, for example, a transistor such as a reset transistor, a source follower transfer, a row select transistor and/or a transfer transistor. In the present disclosure, the switching element 140 and the light-sensing portion 131 of the first semiconductor layer 130 are staggered in a direction perpendicular to the substrate 110.

In FIG. 1, the microstructures 132 are at a side face area 130A of the first semiconductor layer 130 corresponding to the light-sensing portion 131 for enhancing incident light absorption in the light-sensing portion 131 of the first semiconductor layer 130. The material forming the microstructures 132 may be the same as that forming the first semiconductor layer 130. In some embodiments, as shown in FIG. 1, the microstructures 132 are regularly arranged, any two adjacent ones of the microstructures 132 adjoin to each other, and each microstructure 132 has a cross-section in a shape of triangle. In some embodiments, the microstructures 132 may be irregularly arranged. In some embodiments, any two adjacent ones of the microstructures 132 are separated from each other. Further, in some embodiments, each microstructure 132 may have a cross-section in a shape of trapezoid or arc such as semi-circle or semi-ellipse, or other suitable shapes. Each microstructure 132 has a height in a range from about 0.1 µm to about 1 µm and a width in a range from about 0.1 µm to about 3 µm. In some embodiments, the height of each microstructure 132 is in a range from about 0.3 µm to about 0.5 µm. It is noted that, the height and the width of each microstructure 132 may vary in accordance with various design requirements.

The second semiconductor layer 150 is disposed on the microstructures 132 and the switching element 140. The material forming the second semiconductor layer 150 selected to have a refractive index smaller than that of the microstructures 132. In some embodiments, the second semiconductor layer 150 is an epitaxial silicon layer. In various embodiments, the second semiconductor layer 150 may include a material such as silicon, germanium, epitaxial germanium, combinations thereof, or the like.

The passivation layer 160, the color filter layer 170 and the micro-lens layer 180 are sequentially disposed on the second semiconductor layer 150. The passivation layer 160 includes a transparent material such as silicon oxide, silicon nitride, combinations thereof, or the like. In some embodiments, a refractive index of the passivation layer 160 is smaller than that of the second semiconductor layer 150. The color filter layer 170 includes various color filters, such as red color filters, green color filters and blue color filters, for filtering the incident light to thereby obtain red, green and blue lights. In some embodiments, the color filter layer 170 includes a dyed or pigmented material such as polymer, or other suitable material. The micro-lens layer 180 includes micro-lenses for focusing the incident light onto the light-sensing portion 131. The micro-lens layer 180 may be formed in various arrangements and various shapes depending on a refractive index of the micro-lenses and distances between the light-sensing portion 131 and the micro-lenses. In addition, the micro-lens layer 180 may be formed of any material that may be patterned and formed into lenses with high transmittance, such as acrylic polymer or another suitable material.

Figure 2A:
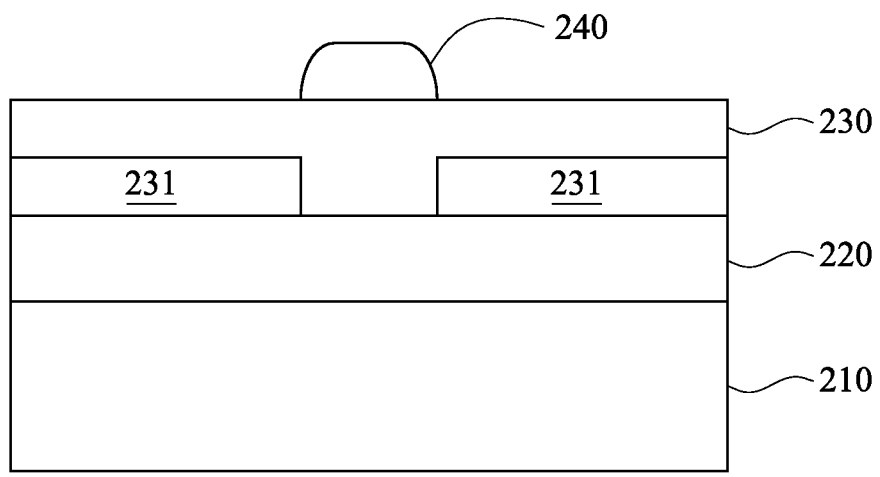
FIG. 2A through FIG. 2D are schematic cross-sectional views of intermediate stages illustrating a method for fabricating a semiconductor device in accordance with some embodiments.

Referring to FIG. 2A through FIG. 2D, FIG. 2A through FIG. 2D are schematic cross-sectional views of intermediate stages illustrating a method for fabricating a semiconductor device 200 in accordance with some embodiments. In FIG. 2A, a substrate 210 is provided, and a wiring layer 220, a first semiconductor layer 230 and a switching element 240 are sequentially formed on the substrate 210. The substrate 210 is a semiconductor substrate, which is formed including, but not limited to, a semiconductor wafer, an SOI substrate or an epitaxial substrate. In some embodiments, the substrate 210 is formed further including an elementary semiconductor such as silicon, germanium or diamond. In various embodiments, the substrate 210 is formed further including a compound semiconductor such as silicon carbide, gallium arsenic, gallium carbide, gallium phosphide, indium arsenide, or indium phosphide, or an alloy semiconductor such as silicon germanium, silicon germanium carbide, gallium arsenic phosphide or gallium indium phosphide.

The wiring layer 220 is formed to electrically interconnect with a light-sensing portion 231 of the first semiconductor layer 230 and/or the switching element 240. In some embodiments, the wiring layer 220 is formed having conductive features, which may include a material such as aluminum, aluminum alloy, copper, copper alloy, titanium, titanium nitride, polysilicon, metal silicide, combinations thereof, or the like. Further, in some embodiments, a passivation layer (not shown) may be additionally formed between the wiring layer 220 and the substrate 210.

The first semiconductor layer 230 is formed including the light-sensing portion 231 for sensing incident light. The light-sensing portion 231 may be formed by using a diffusion process, an ion implantation process, or the like. In some embodiments, the light-sensing portion 231 is formed including a photo-sensitive element such as a photodiode, a pinned photodiode, a partially pinned photodiode, a photogate, a photo transistor, or the like.

The switching element 240 is formed for transferring electric charges generated from the light-sensing portion 231. The switching element 240 may be, for example, a transistor such as a reset transistor, a source follower transfer, a row select transistor and/or a transfer transistor. The switching element 240 and the light-sensing portion 231 of the first semiconductor layer 230 are formed staggered in a direction perpendicular to the substrate 210.

Figure 2B:
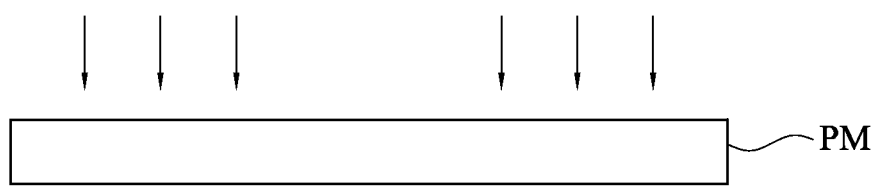
Figure 2B:
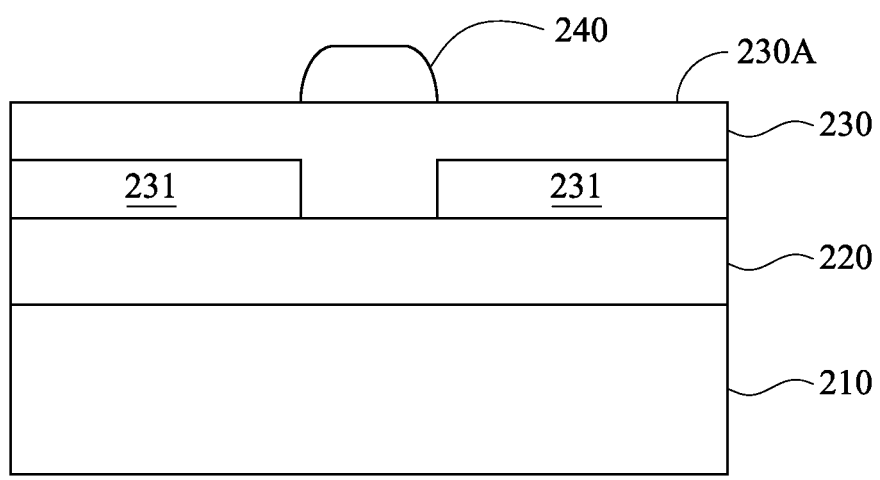
Figure 2C:
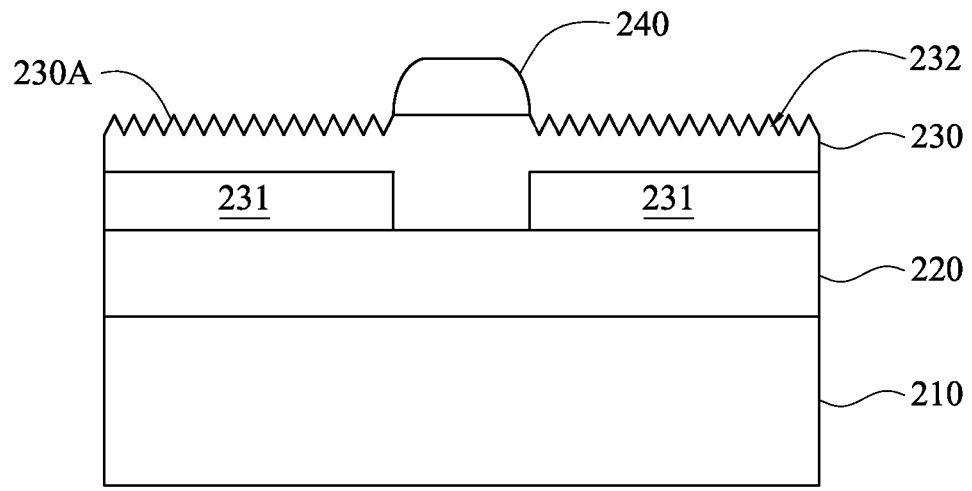

In FIG. 2B, a lithography process and an etching process are performed to the light-sensing portion 231. A photo mask PM toward the first semiconductor layer 230 is used for the lithography process. The photo mask PM defines an etching region where a side face area 230A corresponding to the light-sensing portion 231 is to be etched. The side face area 230A is uncovered by the switching element 240. After the lithography process and the etching process, microstructures 232 are formed at the side face area 230A corresponding to the light-sensing portion 231, as shown in FIG. 2C.

In some embodiments, the lithography process is performed to form a photoresist layer (not shown) on the first semiconductor layer 230 and the switching element 240. At first, the photoresist layer (not shown) is formed on the first semiconductor layer 230 and the switching element 240 by a process such as spin-on coating, chemical vapor deposition (CVD), plasma enhanced chemical vapor deposition (PECVD), high density plasma CVD (HDPCVD), physical vapor deposition (PVD), atomic layer deposition (ALD), combinations thereof, or the like. Next, the photoresist layer (not shown) is patterned by projecting light through a photo mask PM toward the photoresist layer (not shown). In some embodiments, the photo mask PM is a gray scale photo mask for patterning the photoresist layer (not shown). Then, the etching process is performed to etch the side face area 230A corresponding to the light-sensing portion 231. The etching process is performed by using a dry etching technique, a wet etching technique, a chemical etching technique, or the like. After the etching process, the microstructures 232 are formed at the side face area 230A. Last, the photoresist layer (not shown) is removed by a plasma ashing process or another suitable process.

The shape and arrangement of the microstructures 232 may be determined in accordance with the photo mask PM for various demands. In some embodiments, as shown in FIG. 2C, the microstructures 232 are formed regularly arranged, any two adjacent ones of the microstructures 232 adjoin to each other, and each microstructure 232 has a cross-section in a shape of triangle. In some embodiments, the microstructures 232 may be formed irregularly arranged. In some embodiments, any two adjacent ones of the microstructures 232 are formed separated from each other. Further, in some embodiments, each microstructure 232 may be formed having a cross-section in a shape of trapezoid or arc such as semi-circle or semi-ellipse, or other suitable shapes. Each microstructure 232 is formed having a height in a range from about 0.1 µm to about 1 µm and a width in a range from about 0.1 µm to about 3 µm. In some embodiments, the height of each microstructure 232 is in a range from about 0.3 µm to about 0.5 µm.

It is noted that, the microstructures 232 may be formed by using another technique than the foregoing lithography process and etching process. In certain examples, the microstructures 232 may be formed by using a laser removing technique. Alternatively, the microstructures 232 may be directly formed on the side face area 230A of the first semiconductor layer 230 by using deposition technique rather than removing a part of the first semiconductor layer 230 by using etching or laser removing technique.

Figure 2D:
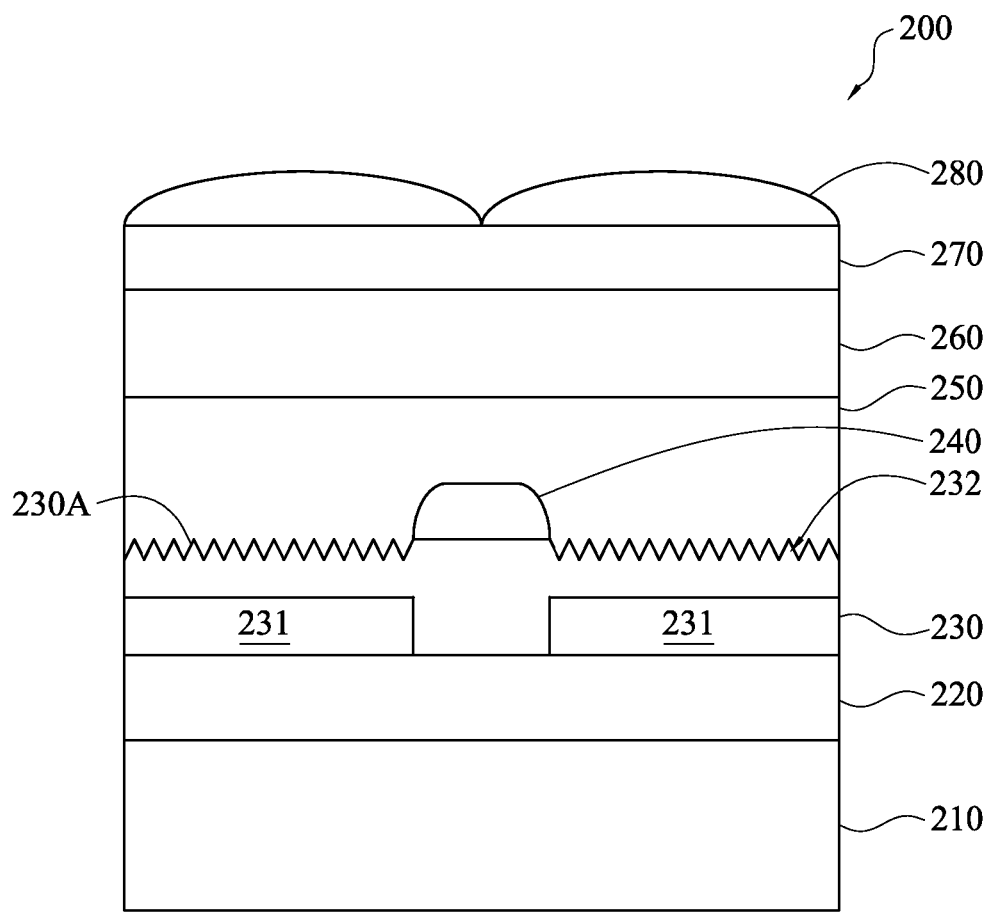

In FIG. 2D, the second semiconductor layer 250 is formed on the microstructures 232 and the switching element 240, and the passivation layer 260, the color filter layer 270 and the micro-lens layer 280 are sequentially formed on the second semiconductor layer 250. The material of the second semiconductor layer 250 is selected to have a refractive index smaller than that of the microstructures 232. In some embodiments, the second semiconductor layer 250 is an epitaxial silicon layer. In various embodiments, the second semiconductor layer 250 may be formed including a material such as silicon, germanium, epitaxial germanium, combinations thereof, or the like. The second semiconductor layer 250 may be formed by a process such as CVD, low-pressure CVD (LPCVD), metal organic CVD (MOCVD), PECVD, PVD, ALD, molecular beam epitaxy (MBE), or another suitable process.

The passivation layer 260 is formed on the second semiconductor layer 250. The passivation layer 260 is formed including a transparent material such as silicon oxide, silicon nitride, combinations thereof, or the like. The passivation layer 260 may be formed by a deposition process such as CVD, PVD, ALD, combinations thereof, or the like. In some embodiments, the passivation layer 260 is formed having a refractive index smaller than that of the second semiconductor layer 250.

The color filter layer 270 is formed on the passivation layer 260. For certain examples, the color filter layer 270 includes various color filters, such as red color filters, green color filters and blue color filters, for filtering the incident light to thereby obtain red, green and blue lights. The color filter layer 270 may include a dyed or pigmented material such as polymer, or another suitable material. In some embodiments, the color filter layer 270 is selectively patterned and formed by an exposure and development process using a photo mask.

The micro-lens layer 280 is formed on the color filter layer 270. The micro-lens layer 280 includes micro-lenses for focusing the incident light onto the light-sensing portion 231. The micro-lens layer 280 may be formed in various arrangements and various shapes depending on a refractive index of the micro-lenses and distances between the light-sensing portion 231 and the micro-lenses. The micro-lens layer 280 may be formed of any material that may be patterned and formed into lenses with high transmittance, such as acrylic polymer or another suitable material. In some embodiments, the micro-lens layer 280 is formed using a material in a liquid state by a spin-on technique. In some embodiments, the micro-lens layer 280 is formed by another method, such as CVD, PVD, combinations thereof, or the like.

Figure 3:
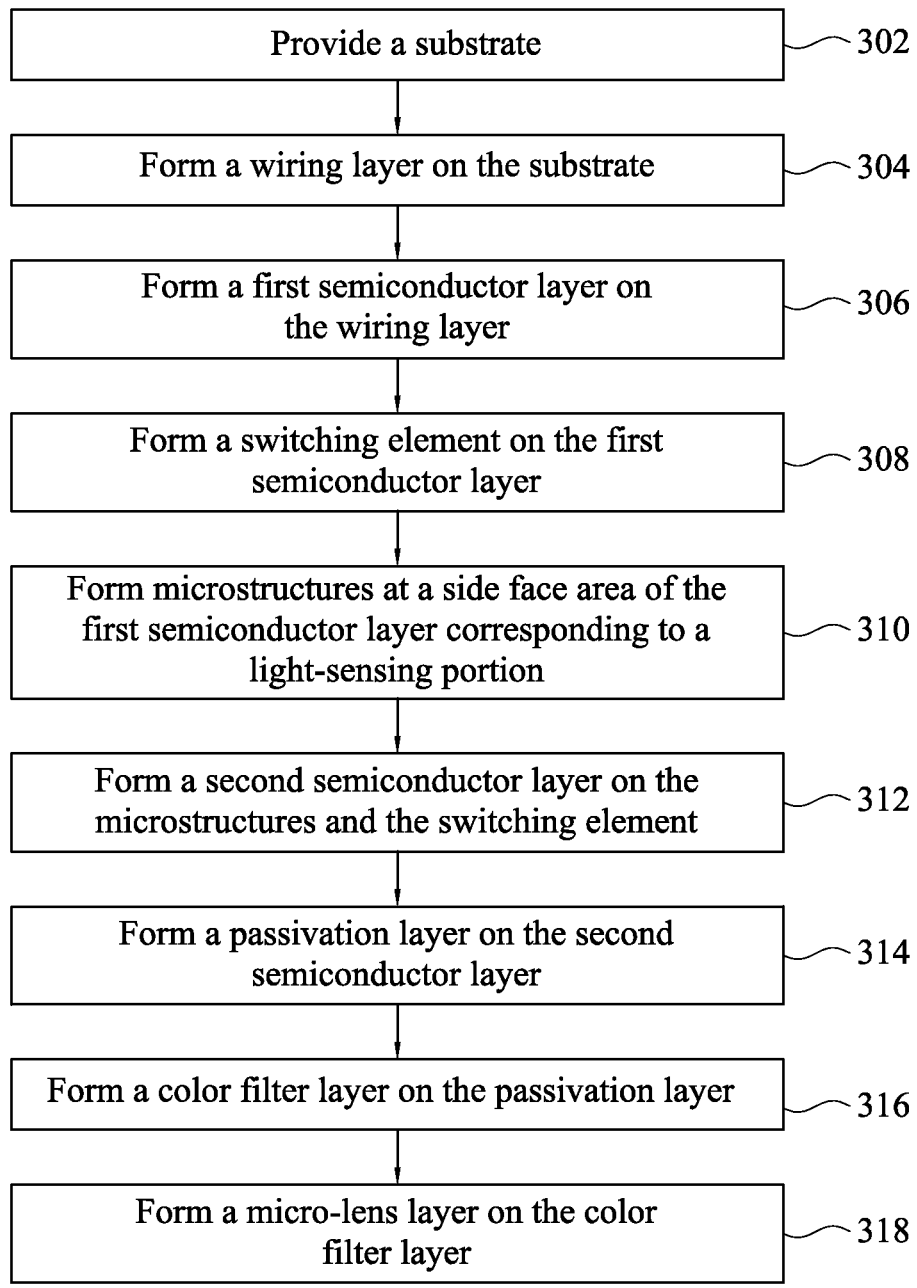
FIG. 3 is a flowchart illustrating a method for fabricating a semiconductor device in accordance with some embodiments.

Referring to FIG. 3 with FIG. 2A through FIG. 2D, FIG. 3 is a flow chart of a method 300 for fabricating a semiconductor device in accordance with some embodiments. The method 300 begins at operation 302, where a substrate 210 is provided. The substrate 210 is a semiconductor substrate, which is formed including, but not limited to, a semiconductor wafer, an SOI substrate or an epitaxial substrate. In some embodiments, the substrate 210 is formed further including an elementary semiconductor such as silicon, germanium or diamond. In various embodiments, the substrate 210 is formed further including a compound semiconductor such as silicon carbide, gallium arsenic, gallium carbide, gallium phosphide, indium arsenide, or indium phosphide, or an alloy semiconductor, such as silicon germanium, silicon germanium carbide, gallium arsenic phosphide or gallium indium phosphide.

At operation 304, a wiring layer 220 is formed on the substrate 210. In some embodiments, the wiring layer 220 is formed having conductive features (not shown), which may include a material such as aluminum, aluminum alloy, copper, copper alloy, titanium, titanium nitride, polysilicon, metal silicide, combinations thereof, or the like.

At operation 306, a first semiconductor layer 230 is formed on the wiring layer 220. The first semiconductor layer 230 is formed including a light-sensing portion 231, which may be formed by using a diffusion process, an ion implantation process, or the like.

At operation 308, a switching element 240 is formed on the first semiconductor layer 230. The switching element 240 and the light-sensing portion 231 of the first semiconductor layer 230 are formed staggered in a direction perpendicular to the substrate 210. In other words, the switching element 240 is formed uncovering the light-sensing portion 231.

At operation 310, microstructures 232 are formed at a side face area 230A of the first semiconductor layer 230 corresponding to the light-sensing portion 231. The microstructures 232 are formed by performing a lithography process and an etching process to the light-sensing portion 231. The lithography process may performed by using a process such as spin-on coating, CVD, PECVD, HDPCVD, PVD, ALD, combinations thereof, or the like. The etching process may be performed by using a dry etching technique, a wet etching technique, a chemical etching technique, or the like. Alternatively, in another embodiments, the microstructures 232 may be formed by using a laser removing technique.

At operation 312, a second semiconductor layer 250 is formed on the microstructures 232 and the switching element 240. The second semiconductor layer 250 is formed having a refractive index smaller than that of the microstructures 232. In some embodiments, the second semiconductor layer 250 is an epitaxial silicon layer. In various embodiments, the second semiconductor layer 250 may be formed including a material such as silicon, germanium, epitaxial germanium, combinations thereof, or the like. The second semiconductor layer 250 may be formed by a process such as CVD, LPCVD, MOCVD, PECVD, PVD, ALD, MBE, or another suitable process.

At operation 314, a passivation layer 260 is formed on the second semiconductor layer 250. The passivation layer 260 is formed including a transparent material such as silicon oxide, silicon nitride, combinations thereof, or the like. The passivation layer 260 may be formed by a deposition process such as CVD, PVD, ALD, combinations thereof, or the like. In some embodiments, the passivation layer 260 is formed having a refractive index smaller than that of the second semiconductor layer 250.

At operation 316, a color-filter layer 270 is formed on the passivation layer 260. The color filter layer 270 may include a dyed or pigmented material such as polymer, or another suitable material. In some embodiments, the color filter layer 270 is selectively patterned and formed by an exposure and development process using a photo mask.

At operation 318, a micro-lens layer 280 is formed on the color-filter layer 270. The micro-lens layer 280 may be formed using a material in a liquid state by a spin-on technique. In some embodiments, the micro-lens layer 280 is formed of any material that may be patterned and formed into lenses with high transmittance, such as acrylic polymer or another suitable material. In some embodiments, the micro-lens layer 280 is formed by another method, such as CVD, PVD, combinations thereof, or the like.

Figure 4:
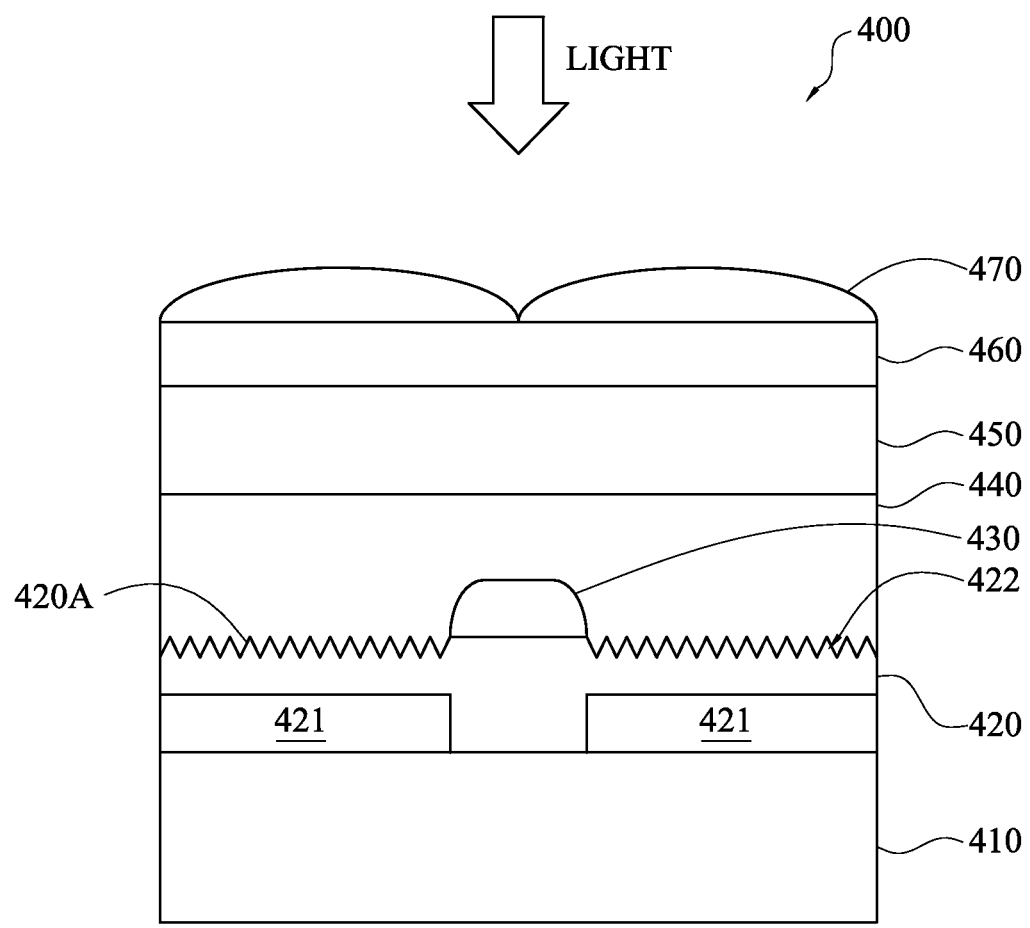
FIG. 4 is a schematic cross-sectional view of a semiconductor device in accordance with some embodiments.

The foregoing microstructures may be applied in a front side illustrated (FSI) image sensor device. FIG. 4 is schematic cross-sectional view of a semiconductor device 400 in accordance with some embodiments. The semiconductor device 400 is an FSI image sensor device configured for sensing incident light. In the present disclosure, the semiconductor device 400 is an FSI CMOS image sensor device. As shown in FIG. 4, the semiconductor device 400 includes a substrate 410, a semiconductor layer 420, microstructures 422, a switching element 430, a wiring layer 440, a passivation layer 450, a color filter layer 460 and a micro-lens layer 470. The substrate 410 is a semiconductor substrate, which includes, but not limited to, a semiconductor wafer, an SOI substrate or an epitaxial substrate. In some embodiments, the substrate 410 further includes an elementary semiconductor such as silicon, germanium or diamond. In another embodiments, the substrate 410 further includes a compound semiconductor such as silicon carbide, gallium arsenic, gallium carbide, gallium phosphide, indium arsenide, or indium phosphide, or an alloy semiconductor such as silicon germanium, silicon germanium carbide, gallium arsenic phosphide or gallium indium phosphide.

The semiconductor layer 420 and the switching element 430 are sequentially disposed on the substrate 410. The semiconductor layer 420 includes a light-sensing portion 421 for sensing incident light. In some embodiments, the light-sensing portion 421 includes a photo-sensitive element such as a photodiode, a pinned photodiode, a partially pinned photodiode, a photogate, a photo transistor, or the like. Further, in some embodiments, a passivation layer (not shown) may be additionally formed between the semiconductor layer 420 and the substrate 410.

The switching element 430 is disposed on the semiconductor layer 420, and is used for transferring electric charges generated from the light-sensing portion 421. In some embodiments, the switching element may be, for example, a transistor such as a reset transistor, a source follower transfer, a row select transistor and/or a transfer transistor. In the present disclosure, the switching element 430 and the light-sensing portion 421 of the semiconductor layer 420 are staggered in a direction perpendicular to the substrate 410.

In FIG. 4, the microstructures 422 are at a side face area 420A of the first semiconductor layer 420 corresponding to the light-sensing portion 421 for enhancing incident light absorption in the light-sensing portion 421. The material forming the microstructures 422 may be the same as that forming the semiconductor layer 420. In some embodiments, as shown in FIG. 4, the microstructures 422 are regularly arranged, any two adjacent ones of the microstructures 422 adjoin to each other, and each microstructure 422 has a cross-section in a shape of triangle. In some embodiments, the microstructures 422 may be irregularly arranged. In some embodiments, any two adjacent ones of the microstructures 422 are separated from each other. Further, in some embodiments, each microstructure 422 may have a cross-section in a shape of trapezoid or arc such as semi-circle or semi-ellipse, or other suitable shapes. Each microstructure 422 has a height in a range from about 0.1 µm to about 1 µm and a width in a range from about 0.1 µm to about 3 µm. In some embodiments, the height of each microstructure 422 is in a range from about 0.3 µm to about 0.5 µm. It is noted that, the height and the width of each microstructure 422 may vary in accordance with various design requirements.

The wiring layer 440 is disposed on the microstructures 422 and the switching element 430. A refractive index of the wiring layer 440 is smaller than that of the microstructures 422. The wiring layer 440 includes conductive features (not shown) for electrical interconnection with the light-sensing portion 421 and/or the switching element 430. In some embodiments, the conductive features (not shown) may include a material such as aluminum, aluminum alloy, copper, copper alloy, titanium, titanium nitride, polysilicon, metal silicide, combinations thereof, or the like.

The passivation layer 450, the color filter layer 460 and the micro-lens layer 470 are sequentially disposed on the wiring layer 440. The passivation layer 450 includes a transparent material such as silicon oxide, silicon nitride, combinations thereof, or the like. In some embodiments, a refractive index of the passivation layer 450 is smaller than that of the wiring layer 440. The color filter layer 460 includes various color filters, such as red color filters, green color filters and blue color filters, for filtering the incident light to thereby obtain red, green and blue lights. In some embodiments, the color filter layer 460 includes a dyed or pigmented material such as polymer, or other suitable material. The micro-lens layer 470 includes micro-lenses for focusing the incident light onto the light-sensing portion 421. The micro-lens layer 470 may be formed in various arrangements and various shapes depending on a refractive index of the micro-lenses and distances between the light-sensing portion 421 and the micro-lenses. In addition, the micro-lens layer 470 may be formed of any material that may be patterned and formed into lenses with high transmittance, such as acrylic polymer or another suitable material.

Figure 5A:
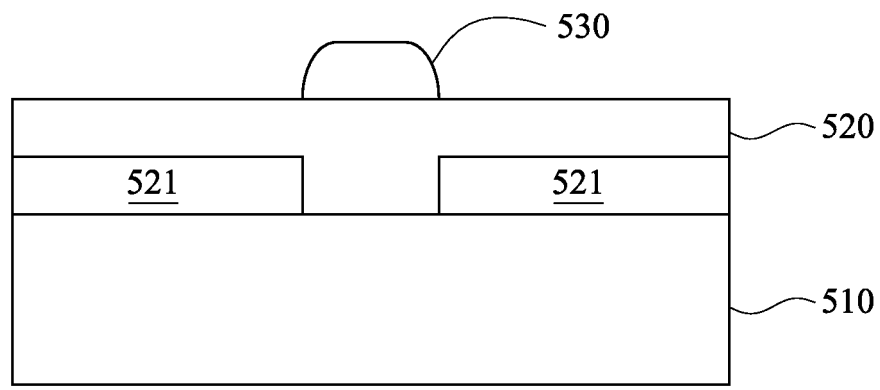
FIG. 5A through FIG. 5D are schematic cross-sectional views of intermediate stages illustrating a method for fabricating a semiconductor device in accordance with some embodiments.

Referring to FIG. 5A through FIG. 5D, FIG. 5A through FIG. 5D are schematic cross-sectional views of intermediate stages illustrating a method for fabricating a semiconductor device 500 in accordance with some embodiments. In FIG. 5A, a substrate 510 is provided, and a semiconductor layer 520 and a switching element 530 are sequentially formed on the substrate 510. The substrate 510 is a semiconductor substrate, which is formed including, but not limited to, a semiconductor wafer, an SOI substrate or an epitaxial substrate. In some embodiments, the substrate 510 is formed further including an elementary semiconductor such as silicon, germanium or diamond. In various embodiments, the substrate 510 is formed further including a compound semiconductor such as silicon carbide, gallium arsenic, gallium carbide, gallium phosphide, indium arsenide, or indium phosphide, or an alloy semiconductor, such as silicon germanium, silicon germanium carbide, gallium arsenic phosphide or gallium indium phosphide.

The semiconductor layer 520 is formed including the light-sensing portion 521 for sensing incident light. The light-sensing portion 521 may be formed by using a diffusion process, an ion implantation process, or the like. In some embodiments, the light-sensing portion 521 is formed including a photo-sensitive element such as a photodiode, a pinned photodiode, a partially pinned photodiode, a photogate, a photo transistor, or the like.

The switching element 530 is formed for transferring electric charges generated from the light-sensing portion 521. The switching element 530 may be, for example, a transistor such as a reset transistor, a source follower transfer, a row select transistor and/or a transfer transistor. The switching element 530 and the light-sensing portion 521 of the semiconductor layer 520 are formed staggered in a direction perpendicular to the substrate 510.

Figure 5B:
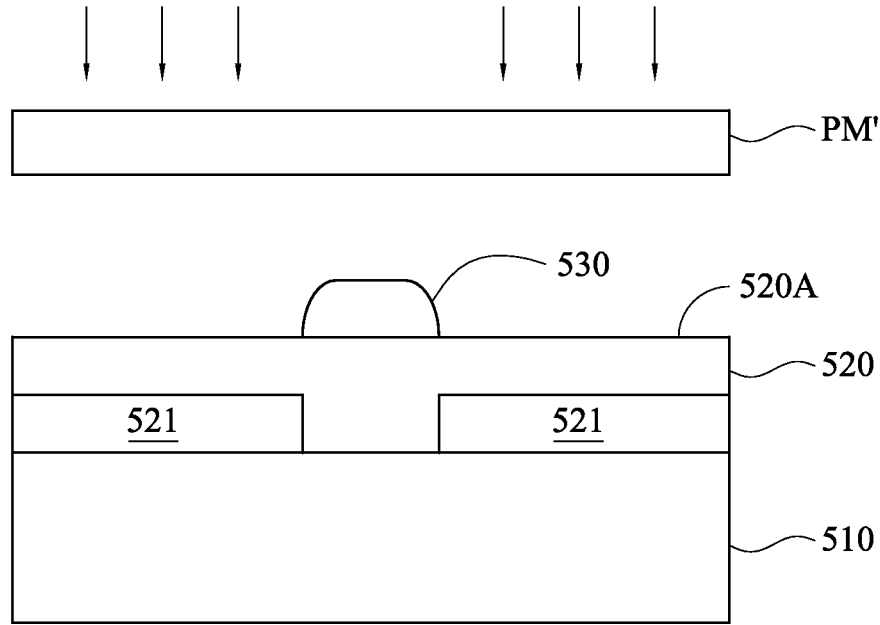
Figure 5C:
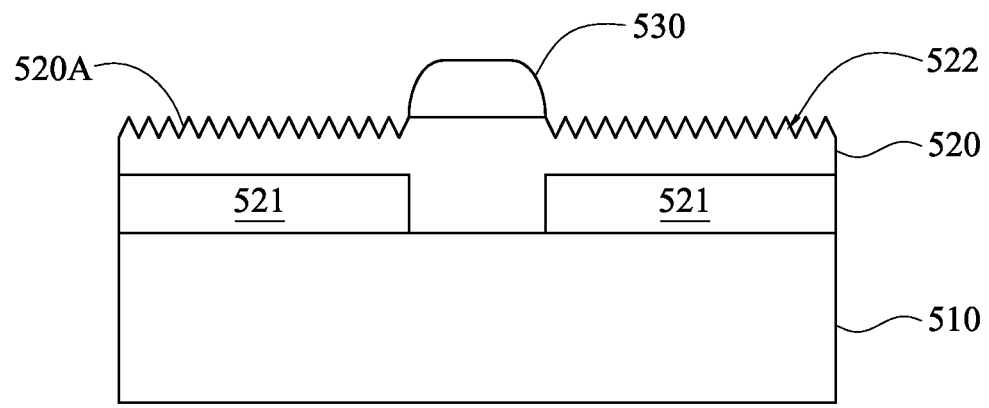

In FIG. 5B, a lithography process and an etching process are performed to the light-sensing portion 521. A photo mask PM' toward the semiconductor layer 520 is used for the lithography process. The photo mask PM' defines an etching region where a side face area 520A corresponding to the light-sensing portion 521 is to be etched. The side face area 520A is uncovered by the switching element 530. After the lithography process and the etching process, microstructures 522 are formed at the side face area 520A corresponding to the light-sensing portion 521, as shown in FIG. 5C.

In some embodiments, the lithography process is performed to form a photoresist layer (not shown) on the semiconductor layer 520 and the switching element 530. At first, the photoresist layer (not shown) is formed on the semiconductor layer 520 and the switching element 530 by a process such as spin-on coating, CVD, PECVD, HDPCVD, PVD, ALD, combinations thereof, or the like. Next, the photoresist layer (not shown) is patterned by projecting light through a photo mask PM' toward the photoresist layer (not shown). In some embodiments, the photo mask PM' is a gray scale photo mask for pattering the photoresist layer (not shown). Then, the etching process is performed to etch the side face area 520A corresponding to the light-sensing portion 521. The etching process is performed by using a dry etching technique, a wet etching technique, a chemical etching technique, or the like. After the etching process, the microstructures 522 are formed at the side face area 520A. Last, the photoresist layer (not shown) is removed by a plasma ashing process or another suitable process.

The shape and arrangement of the microstructures 522 may be determined in accordance with the photo mask PM' for various demands. In some embodiments, as shown in FIG. 5C, the microstructures 522 are formed regularly arranged, any two adjacent ones of the microstructures 522 adjoin to each other, and each microstructure 522 has a cross-section in a shape of triangle. In some embodiments, the microstructures 522 may be formed irregularly arranged. In some embodiments, any two adjacent ones of the microstructures 522 are formed separated from each other. Further, in some embodiments, each microstructure 522 may be formed having a cross-section in a shape of trapezoid or arc such as semi-circle or semi-ellipse, or other suitable shapes. Each microstructure 522 is formed having a height in a range from about 0.1 μm to about 1 μm and a width in a range from about 0.1 μm to about 3 μm. In some embodiments, the height of each microstructure 522 is in a range from about 0.3 μm to about 0.5 μm.

It is noted that, the microstructures 522 may be formed by using another technique than the foregoing lithography process and etching process. In certain examples, the microstructures 522 may be formed by using a laser removing technique. Alternatively, the microstructures 522 may be directly formed on the side face area 520A of the semiconductor layer 520 by using deposition technique rather than removing a part of the semiconductor layer 520 by using etching or laser removing technique.

Figure 5D:
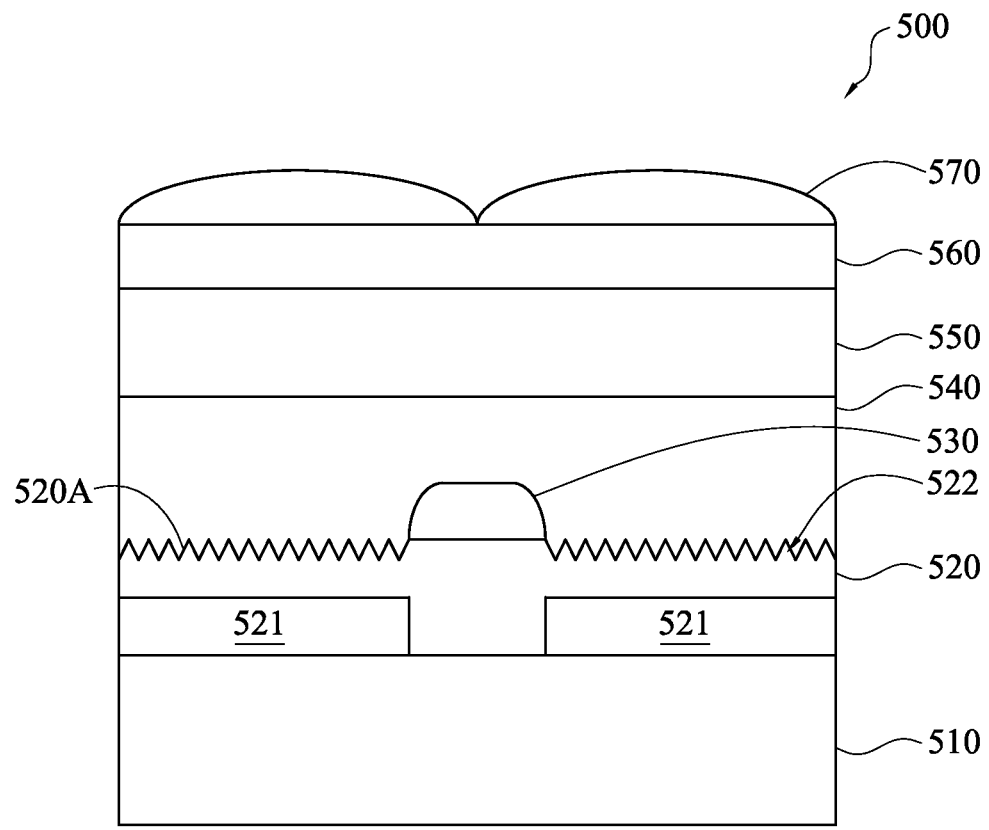

In FIG. 5D, the wiring layer 540 is formed on the microstructures 522 and the switching element 530, and the passivation layer 550, the color filter layer 560 and the micro-lens layer 570 are sequentially formed on the wiring layer 540. The wiring layer 540 is formed on the microstructures 522 and the switching element 530. The wiring layer 540 is formed having a refractive index smaller than that of the microstructures 522. The wiring layer 540 includes conductive features (not shown) for electrical interconnection with the light-sensing portion 521 and/or the switching element 530. In some embodiments, the conductive features (not shown) may include a material such as aluminum, aluminum alloy, copper, copper alloy, titanium, titanium nitride, polysilicon, metal silicide, combinations thereof, or the like.

The passivation layer 550 is formed on the wiring layer 540. The passivation layer 550 is formed including a transparent material such as silicon oxide, silicon nitride, combinations thereof, or the like. The passivation layer 550 may be formed by a deposition process such as CVD, PVD, ALD, combinations thereof, or the like. In some embodiments, the passivation layer 550 is formed having a refractive index smaller than that of the wiring layer 540.

The color filter layer 560 is formed on the passivation layer 550. For certain examples, the color filter layer 560 includes various color filters, such as red color filters, green color filters and blue color filters, for filtering the incident light to thereby obtain red, green and blue lights. The color filter layer 560 may include a dyed or pigmented material such as polymer, or another suitable material. In some embodiments, the color filter layer 560 is selectively patterned and formed by an exposure and development process using a photo mask.

The micro-lens layer 570 is formed on the color filter layer 560. The micro-lens layer 570 includes micro-lenses for focusing the incident light onto the light-sensing portion 521. The micro-lens layer 570 may be formed in various arrangements and various shapes depending on a refractive index of the micro-lenses and distances between the light-sensing portion 521 and the micro-lenses. The micro-lens layer 570 may be formed of any material that may be patterned and formed into lenses with high transmittance, such as acrylic polymer or another suitable material. In some embodiments, the micro-lens layer 570 is formed using a material in a liquid state by a spin-on technique. In some embodiments, the micro-lens layer 570 is formed by another method, such as CVD, PVD, combinations thereof, or the like.

Figure 6:
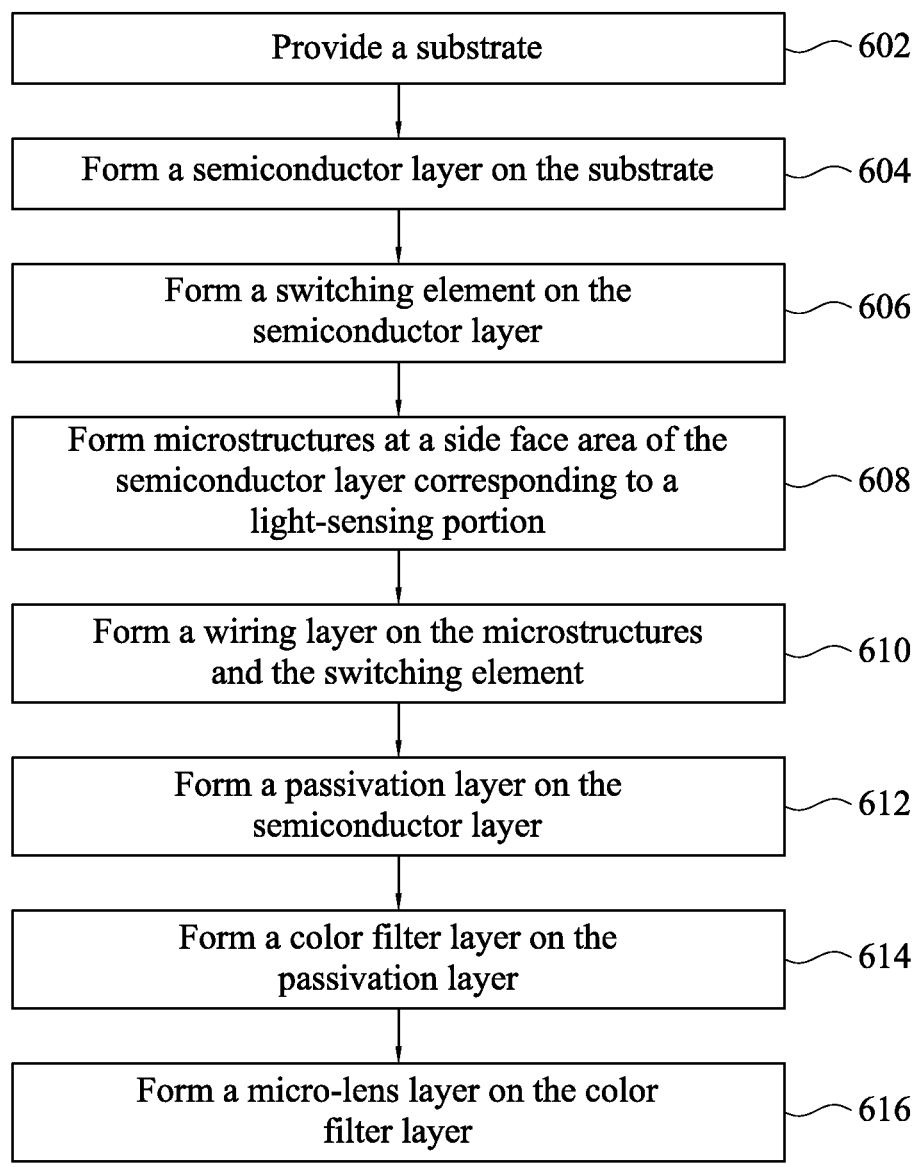
FIG. 6 is a flowchart illustrating a method for fabricating a semiconductor device in accordance with some embodiments.

Referring to FIG. 6 with FIG. 5A through FIG. 5D, FIG. 6 is a flow chart of a method 600 for fabricating a semiconductor device in accordance with some embodiments. The method 600 begins at operation 602, where a substrate 510 is provided. The substrate 510 is a semiconductor substrate, which is formed including, but not limited to, a semiconductor wafer, an SOI substrate or an epitaxial substrate. In some embodiments, the substrate 510 is formed further including an elementary semiconductor such as silicon, germanium or diamond. In various embodiments, the substrate 510 is formed further including a compound semiconductor such as silicon carbide, gallium arsenic, gallium carbide, gallium phosphide, indium arsenide, or indium phosphide, or an alloy semiconductor such as silicon germanium, silicon germanium carbide, gallium arsenic phosphide or gallium indium phosphide.

At operation 604, a semiconductor layer 520 is formed on the substrate 510. The semiconductor layer 520 is formed including a light-sensing portion 521, which may be formed by using a diffusion process, an ion implantation process, or the like.

At operation 606, a switching element 530 is formed on the semiconductor layer 520. The switching element 530 and the light-sensing portion 521 of the semiconductor layer 520 are formed staggered in a direction perpendicular to the substrate 510. In other words, the switching element 530 is formed uncovering the light-sensing portion 521.

At operation 608, microstructures 522 are formed at a side face area 520A of the semiconductor layer 520 corresponding to the light-sensing portion 521. The microstructures 522 are formed by performing a lithography process and an etching process to the light-sensing portion 521. The lithography process may performed by using a process such as spin-on coating, CVD, PECVD, HDPCVD, PVD, ALD, combinations thereof, or the like. The etching process may be performed by using a dry etching technique, a wet etching technique, a chemical etching technique, or the like. Alternatively, in another embodiments, the microstructures 522 may be formed by using a laser removing technique.

At operation 610, a wiring layer 540 is formed on the microstructures 522 and the switching element 530. The wiring layer 540 is formed having a refractive index smaller than that of the microstructures 522. The wiring layer 540 is formed having conductive features (not shown), which may include a material such as aluminum, aluminum alloy, copper, copper alloy, titanium, titanium nitride, polysilicon, metal silicide, combinations thereof, or the like.

At operation 612, a passivation layer 550 is formed on the wiring layer 540. The passivation layer 550 is formed including a transparent material such as silicon oxide, silicon nitride, combinations thereof, or the like. The passivation layer 550 may be formed by a deposition process such as CVD, PVD, ALD, combinations thereof, or the like. In some embodiments, the passivation layer 550 is formed having a refractive index smaller than that of the wiring layer 540.

At operation 614, a color-filter layer 560 is formed on the passivation layer 550. The color filter layer 560 may include a dyed or pigmented material such as polymer, or another suitable material. In some embodiments, the color filter layer 560 is selectively patterned and formed by an exposure and development process using a photo mask.

At operation 616, a micro-lens layer 570 is formed on the color-filter layer 560. The micro-lens layer 570 may be formed using a material in a liquid state by a spin-on technique. In some embodiments, the micro-lens layer 570 is formed of any material that may be patterned and formed into lenses with high transmittance, such as acrylic polymer or another suitable material. In some embodiments, the micro-lens layer 570 is formed by another method, such as CVD, PVD, combinations thereof, or the like.

In accordance with some embodiments, the present disclosure provides a semiconductor device, which includes a substrate, a first semiconductor layer and a switching element. The semiconductor layer is disposed on the substrate. The first semiconductor layer has a light-sensing portion and includes microstructures at a side face area corresponding to the light-sensing portion. The switching element is disposed on the first semiconductor layer. In the semiconductor device, the switching element and the light-sensing portion are staggered in a direction perpendicular to the substrate.

In accordance with some embodiments, the present disclosure discloses a method for fabricating a semiconductor device. In this method, a substrate is provided. A wiring layer is formed on the substrate. A first semiconductor layer is formed on the wiring layer and has a light-sensing portion. A switching element is formed on the first semiconductor layer. Microstructures are formed at a side face area corresponding to the light-sensing portion. A second semiconductor layer is formed on the microstructures and the switching element. In the semiconductor device, the switching element and the light-sensing portion are staggered in a direction perpendicular to the substrate.

In accordance with some embodiments, the present disclosure discloses a method for fabricating a semiconductor device. In this method, a substrate is provided. A semiconductor layer is formed on the substrate and has a light-sensing portion. A switching element is formed on the semiconductor layer. Microstructures are formed at a side face area corresponding to the light-sensing portion. A wiring layer is formed on the microstructures and the switching element. In the semiconductor device, the switching element and the light-sensing portion are staggered in a direction perpendicular to the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate;
    a first semiconductor layer on the substrate, wherein the first semiconductor layer has a light-sensing portion and comprises a plurality of microstructures at a side face area of the first semiconductor layer corresponding to the light-sensing portion; and
    a switching element on the first semiconductor layer, wherein the switching element and the light-sensing portion are staggered.

2. The semiconductor device of claim 1, further comprising:
    a wiring layer sandwiched between the substrate and the first semiconductor layer; and
    a second semiconductor layer on the microstructures and the switching element.

3. The semiconductor device of claim 2, wherein a refractive index of the second semiconductor layer is smaller than a refractive index of the microstructures.

4. The semiconductor device of claim 2, further comprising:
    a passivation layer on the second semiconductor layer;
    a color filter layer on the passivation layer; and
    a micro-lens layer on the color filter layer.

5. The semiconductor device of claim 1, further comprising:
a wiring layer on the microstructures and the switching element.

6. The semiconductor device of claim 5, wherein a refractive index of the wiring layer is smaller than a refractive index of the microstructures.

7. The semiconductor device of claim 5, further comprising:
a passivation layer on the wiring layer;
a color filter layer on the passivation layer; and
a micro-lens layer on the color filter layer.

8. The semiconductor device of claim 1, wherein a height of the microstructures is in a range from 0.1 µm to 1 µm.

9. The semiconductor device of claim 1, wherein each of the microstructures has a cross-section in a shape of triangle, trapezoid or arc.

10. A method for fabricating a semiconductor device, the method comprising:
providing a substrate;
forming a wiring layer on the substrate;
forming a first semiconductor layer on the wiring layer, the first semiconductor layer having a light-sensing portion;
forming a switching element on the first semiconductor layer, wherein the switching element and the light-sensing portion are staggered;
forming a plurality of microstructures at a side face area of the first semiconductor layer corresponding to the light-sensing portion; and
forming a second semiconductor layer on the microstructures and the switching element.

11. The method of claim 10, wherein the microstructures are formed by a lithography process and an etching process.

12. The method of claim 10, wherein a refractive index of the second semiconductor layer is smaller than a refractive index of the microstructures.

13. The method of claim 10, further comprising:
forming a passivation layer on the second semiconductor layer;
forming a color filter layer on the passivation layer; and
forming a micro-lens layer on the color filter layer.

14. The method of claim 10, wherein the microstructures are formed having a height in a range from 0.1 µm to 1 µm.

15. The method of claim 10, wherein each of the microstructures is formed with a cross-section in a shape of triangle, trapezoid or arc.

16. A method for fabricating a semiconductor device, the method comprising:
providing a substrate;
forming a semiconductor layer on the substrate, the semiconductor layer having a light-sensing portion;
forming a switching element on the semiconductor layer, wherein the switching element and the light-sensing portion are staggered;
forming a plurality of microstructures at a side face area of the semiconductor layer corresponding to the light-sensing portion; and
forming a wiring layer on the microstructures and the switching element.

17. The method of claim 16, wherein the microstructures are formed by a lithography process and an etching process.

18. The method of claim 16, wherein a refractive index of the wiring layer is smaller than a refractive index of the microstructures.

19. The method of claim 16, further comprising:
forming a passivation layer on the wiring layer;
forming a color filter layer on the passivation layer; and
forming a micro-lens layer on the color filter layer.

20. The method of claim 16, wherein the microstructures are formed having a height in a range from 0.1 µm to 1 µm.

* * * * *